(12) United States Patent
Kavand et al.

(10) Patent No.: US 10,534,737 B2
(45) Date of Patent: Jan. 14, 2020

(54) ACCELERATING DISTRIBUTED STREAM PROCESSING

(71) Applicants: Nima Kavand, Tehran (IR); Armin Darjani, Tehran (IR); Hamid Nasiri Bezenjani, Tehran (IR); Maziar Goudarzi, Tehran (IR)

(72) Inventors: Nima Kavand, Tehran (IR); Armin Darjani, Tehran (IR); Hamid Nasiri Bezenjani, Tehran (IR); Maziar Goudarzi, Tehran (IR)

( * ) Notice: Subject to any disclaimer, the term of this patent is extended or adjusted under 35 U.S.C. 154(b) by 0 days.

(21) Appl. No.: 16/396,798

(22) Filed: Apr. 29, 2019

(65) Prior Publication Data

US 2019/0251048 A1 Aug. 15, 2019

Related U.S. Application Data

(60) Provisional application No. 62/664,158, filed on Apr. 29, 2018.

(51) Int. Cl.
| | |
|---|---|
| *G06F 13/28* | (2006.01) |
| *G06F 9/54* | (2006.01) |
| *G06F 17/50* | (2006.01) |
| *G06F 9/38* | (2018.01) |

(52) U.S. Cl.
CPC ............ *G06F 13/28* (2013.01); *G06F 9/3877* (2013.01); *G06F 9/541* (2013.01); *G06F 17/5054* (2013.01); *G06F 2213/0026* (2013.01)

(58) Field of Classification Search
None
See application file for complete search history.

(56) References Cited

U.S. PATENT DOCUMENTS

| | | | |
|---|---|---|---|
| 9,313,134 B2 | 4/2016 | Dutta | |
| 9,342,564 B2 | 5/2016 | Jung | |
| 9,600,429 B2 * | 3/2017 | Pope | .................. G06F 13/385 |

(Continued)

OTHER PUBLICATIONS

Alioto et al. "RETHINK big: European roadmap for hardware anc networking optimizations for big data." In Design, Automation & Test in Europe Conference & Exhibition (DATE), 2017, pp. 121-126. IEEE, 2017.

*Primary Examiner* — Michael Sun
(74) *Attorney, Agent, or Firm* — Bajwa IP Law Firm; Haris Zaheer Bajwa

(57) ABSTRACT

A method for accelerating distributed stream processing. The method includes allocating a hardware accelerator to a topology for distributed stream processing. The topology includes a spout and a plurality of bolts. The spout is configured to prepare a plurality of tuples. The plurality of bolts are configured to process the plurality of tuples and include at least one proxy bolt. The proxy bolt is configured to perform a proxy operation on an input tuple of the plurality of tuples. The method further includes obtaining a customized hardware accelerator by customizing the hardware accelerator based on the proxy operation, sending the input tuple from the proxy bolt to the customized hardware accelerator, generating an output tuple of the plurality of tuples by performing the proxy operation on the input tuple in the customized hardware accelerator, and sending the output tuple from the customized hardware accelerator to the proxy bolt.

18 Claims, 13 Drawing Sheets

(56) References Cited

U.S. PATENT DOCUMENTS

| | | | |
|---|---|---|---|
| 2015/0103837 A1* | 4/2015 | Dutta | H04L 47/125 370/401 |
| 2015/0199214 A1 | 7/2015 | Lee | |
| 2016/0267142 A1* | 9/2016 | Cafarella | G06F 16/24568 |
| 2018/0189638 A1* | 7/2018 | Nurvitadhi | G06N 3/063 |

* cited by examiner

ACCELERATING DISTRIBUTED STREAM PROCESSING

CROSS-REFERENCE TO RELATED APPLICATION

This application claims the benefit of priority from U.S. Provisional Patent Application Ser. No. 62/664,158, filed on Apr. 29, 2018, and entitled "FPGA-ACCELERATED BIG DATA DISTRIBUTED STREAM PROCESSING FRAMEWORK," which is incorporated herein by reference in its entirety.

TECHNICAL FIELD

The present disclosure generally relates to distributed stream processing frameworks, and particularly, to big data stream processing.

BACKGROUND

Big data stream processing has many applications in social networks, image processing, internet of things (IoT), online control systems, information security, and machine learning. Many Services, such as internet services, cloud computing, portable devices and IoT, increasingly generate big data. Real-time processing of big data may be required for extracting valuable information and features from data, making decisions, and provisioning of services. A main infrastructure of big data processing is data centers. By increasing big data volume, the demand of data centers with more processing power may increase. However, dark silicon limitations may slow down CPU core scaling, leading to a decrease in processing power growth of data centers.

A few approaches entail utilizing hardware accelerators such as graphical processing units (GPUs) for accelerating stream data processing. However, existing solutions may be limited to specific applications. There is, therefore, a need for a reconfigurable method for utilizing hardware accelerators for stream data processing which may configure a hardware accelerator based on a desired operation.

SUMMARY

This summary is intended to provide an overview of the subject matter of the present disclosure, and is not intended to identify essential elements or key elements of the subject matter, nor is it intended to be used to determine the scope of the claimed implementations. The proper scope of the present disclosure may be ascertained from the claims set forth below in view of the detailed description below and the drawings.

In one general aspect, the present disclosure describes an exemplary method for accelerating distributed stream processing. An exemplary method may include allocating a hardware accelerator to a topology for distributed stream processing. In an exemplary embodiment, the topology may include a spout and a plurality of bolts. An exemplary spout may be configured to prepare a plurality of tuples from a data stream. Each of the plurality of tuples may include a respective data structure. An exemplary plurality of bolts may be configured to process the plurality of tuples. In an exemplary embodiment, the plurality of bolts may include a proxy bolt. An exemplary proxy bolt may be configured to perform a proxy operation on an input tuple of the plurality of tuples.

An exemplary method may further include obtaining a customized hardware accelerator by customizing the hardware accelerator based on the proxy operation, sending the input tuple from the proxy bolt to the customized hardware accelerator, generating an output tuple of the plurality of tuples by performing the proxy operation on the input tuple in the customized hardware accelerator, and sending the output tuple from the customized hardware accelerator to the proxy bolt.

In an exemplary embodiment, allocating the hardware accelerator to the topology may include allocating a reconfigurable hardware architecture to the topology. In an exemplary embodiment, allocating the reconfigurable hardware architecture to the topology may include allocating a field programmable gate array (FPGA) to the topology.

In an exemplary embodiment, customizing the hardware accelerator may include obtaining a customized intellectual property (IP) core by customizing an IP core of a plurality of IP cores in the hardware accelerator based on the proxy operation. In an exemplary embodiment, the customized IP core may be associated with the proxy bolt.

In an exemplary embodiment, sending the input tuple from the proxy bolt to the customized hardware accelerator may include extracting an input chunk of a plurality of input chunks from the input tuple, assigning a tag to the input chunk, calling the customized hardware accelerator utilizing an application programming interface (API), and sending the tagged input chunk to a physical layer of the customized hardware accelerator. In an exemplary embodiment, the tag and the API may be associated with the proxy bolt. In an exemplary embodiment, the physical layer may include a peripheral component interconnect express (PCIe) interface.

In an exemplary embodiment, calling the customized hardware accelerator may include sending a transmit request for the tagged input chunk from the proxy bolt to the PCIe interface through a PCIe link utilizing the API, sending the transmit request from the PCIe interface to the receive buffer, sending the transmit request from the receive buffer to an interface module of a plurality of interface modules utilizing a distributor module, generating a read scatter-gather request for a plurality of scatter-gather elements associated with the tagged input chunk in the interface module, sending the read scatter-gather request from the interface module to the transmit buffer utilizing the distributor module, and sending the read scatter-gather request form the transmit buffer to a direct memory access (DMA) controller through the PCIe interface. In an exemplary embodiment, the transmit request may be associated with the tag. In an exemplary embodiment, the read scatter-gather elements stored in a memory.

In an exemplary embodiment, sending the tagged input chunk to the physical layer may include sending the tagged input chunk to the PCIe interface through a PCIe link. In an exemplary embodiment, sending the tagged input chunk to the PCIe interface may include sending each of the plurality of scatter-gather elements from the memory to the PCIe interface through the PCIe link utilizing the DMA controller.

In an exemplary embodiment, performing the proxy operation on the input tuple in the customized hardware accelerator may include sending the tagged input chunk from the physical layer to a receive buffer, sending the tagged input chunk from the receive buffer to the distributor module, extracting the input chunk from the tagged input chunk in the distributor module, sending the input chunk from the distributor module to the interface module, storing the input chunk in a receive first-in-first-out (FIFO) buffer of the interface module, sending the input chunk from the FIFO buffer to the customized IP core, generating an output chunk of a plurality of output chunks from the input chunk by processing the input chunk in the customized IP core, sending the output chunk from the customized IP core to the interface module, sending the output chunk from the interface module to a transmit buffer utilizing the distributor module, and transmitting the output chunk from the transmit buffer to the physical layer. In an exemplary embodiment, the interface module may be associated with the tag.

In an exemplary embodiment, sending the input chunk from the FIFO buffer to the customized IP core may include sending a validity announcement to the customized IP core responsive to the input chunk being stored in the receive FIFO buffer, sending the input chunk from the receive FIFO buffer to the customized IP core responsive to the validity announcement being received in the customized IP core, and sending an acknowledgement from the customized IP core to the interface module responsive to receiving the input chunk from the receive FIFO buffer in the customized IP core.

In an exemplary embodiment, sending the output chunk from the customized IP core to the interface module may include sending the output chunk to a transmit FIFO buffer responsive to receiving an announcement of validity of output data from the customized IP core in the interface module.

In an exemplary embodiment, sending the output tuple from the customized hardware accelerator to the proxy bolt may include determining a destination of the output chunk in the memory based on the tag, converting the output chunk to a PCIe write packet in the interface module, sending the PCIe write packet from the interface module the transmit buffer utilizing the distributor module, sending the PCIe write packet from the transmit buffer to the PCIe interface, and sending the PCIe write packet to the destination from the PCIe interface through the PCIe link utilizing the DMA.

Other exemplary systems, methods, features and advantages of the implementations will be, or will become, apparent to one of ordinary skill in the art upon examination of the following figures and detailed description. It is intended that all such additional systems, methods, features and advantages be included within this description and this summary, be within the scope of the implementations, and be protected by the claims herein.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown, but is to be accorded the widest possible scope consistent with the principles and features disclosed herein.

Herein is disclosed an exemplary method and system for accelerating stream data processing in a distributed stream processing framework (DSPF). The method utilizes a reconfigurable hardware accelerator for implementing processes that may require higher processing power than that of other processes in DSPF. For this purpose, the hardware accelerator may be customized based on the processes that it may need to perform. Input data may be fed to the hardware accelerator from DSPF and the processed data may return to DSPF. The input data may be divided into a number of chunks prior to being processed in the hardware accelerator, and each chunk may be processed separately. This may result in parallel processing of different chunks of the input data. Furthermore, this may entail in simultaneous receiving and transmission of input and processed data, thereby increasing the processing speed of the framework.

Figure 1:
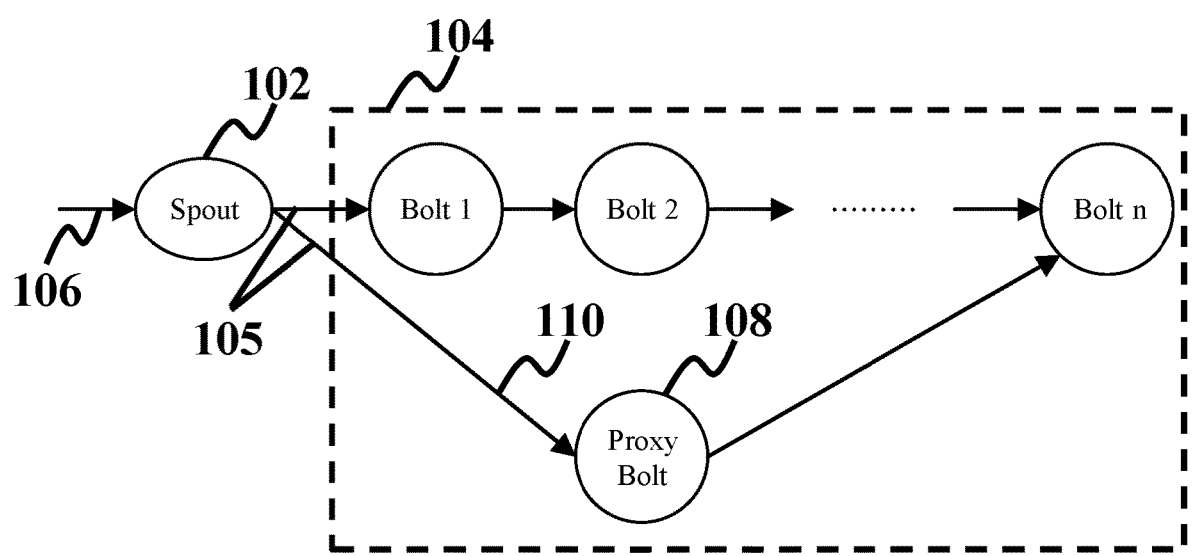
FIG. 1 shows a topology for distributed stream processing, consistent with one or more exemplary embodiments of the present disclosure.

FIG. 1 shows a topology for distributed stream processing, consistent with one or more exemplary embodiments of the present disclosure. An exemplary topology 100 may include a spout 102 and a plurality of bolts 104. In an exemplary embodiment, spout 102 may be configured to prepare a plurality of tuples 105 from a data stream 106. In an exemplary embodiment, each of the plurality of tuples may include a respective data structure. In an exemplary embodiment, plurality of bolts 104 may be configured to process plurality of tuples 105. In an exemplary embodiment, plurality of bolts 104 may include at least one proxy bot, such as proxy bolt 108. In an exemplary embodiment, proxy bolt 108 may be configured to assign a proxy operation on an input tuple 110 of plurality of tuples 105. In an exemplary embodiment, proxy bolt 108 may run on a server that hosts an external hardware to perform the proxy operation. In an exemplary embodiment, the proxy operation may refer to operations that are determined to be performed outside topology 100 utilizing a hardware accelerator, due to resource and speed considerations.

Figure 2A:
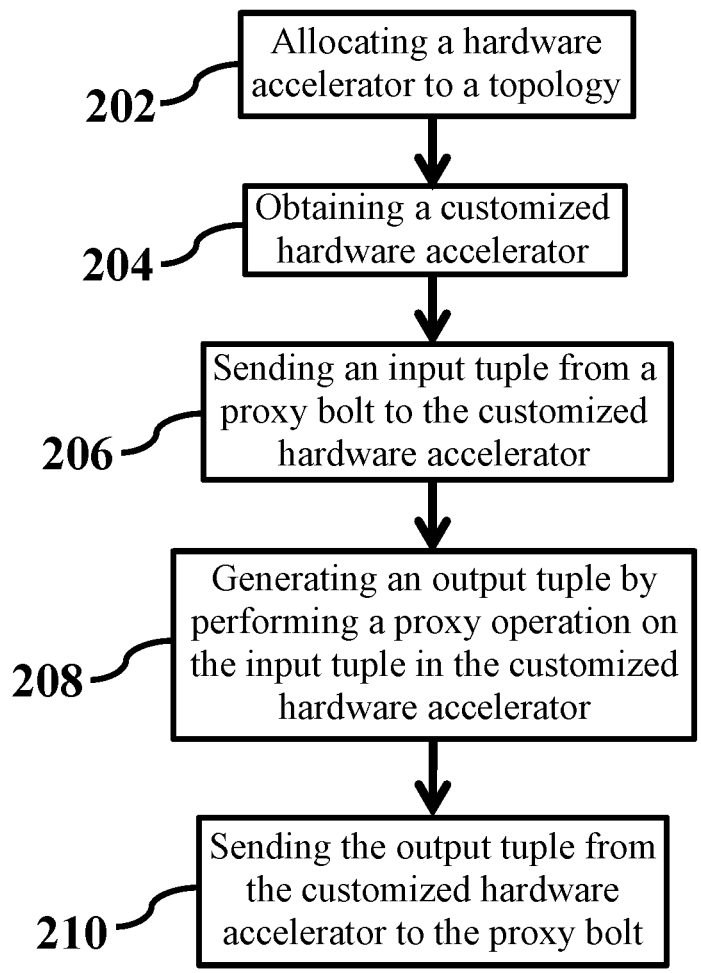
FIG. 2A shows a flowchart of a method for accelerating distributed stream processing, consistent with one or more exemplary embodiments of the present disclosure.

FIG. 2A shows a flowchart of a method for accelerating distributed stream processing, consistent with one or more exemplary embodiments of the present disclosure. An exemplary method 200 may be utilized for accelerating distributed stream processing in a topology analogous to topology 100. In an exemplary embodiment, method 200 may include allocating a hardware accelerator to topology 100 for distributed stream processing (step 202), obtaining a customized hardware accelerator by customizing the hardware accelerator based on the proxy operation (step 204), sending input tuple 110 from proxy bolt 108 to the customized hardware accelerator (step 206), generating an output tuple of plurality of tuples 105 by performing the proxy operation on input tuple 110 in the customized hardware accelerator (step 208), and sending the output tuple from the customized hardware accelerator to proxy bolt 108 (step 210).

For further detail with regards to step 202, in an exemplary embodiment, allocating the hardware accelerator to topology 100 may include allocating a reconfigurable hardware architecture to topology 100. In an exemplary embodiment, allocating the reconfigurable hardware architecture to topology 100 may include determining processing requirements (such as internal memory, number of processing elements, clock frequency, etc.) of the reconfigurable hardware architecture based on processing requirements of the proxy operation. In an exemplary embodiment, allocating the reconfigurable hardware architecture to the topology may include allocating a field programmable gate array (FPGA) to topology 100. In an exemplary embodiment, once the reconfigurable hardware architecture is allocated to topology 100, the proxy operation may be implemented on the reconfigurable hardware architecture.

For further detail with regards to step 204, in an exemplary embodiment, customizing the hardware accelerator may include obtaining a customized intellectual property (IP) core by customizing an IP core of a plurality of IP cores in the hardware accelerator based on the proxy operation. In an exemplary embodiment, the customized IP core may be associated with proxy bolt 108. Hereinafter, customizing the IP core may be referred to designing or loading a custom integrated circuit on the IP core. In an exemplary embodiment, the custom integrated circuit may be designed to perform a set of arithmetic operations associated with the proxy operation. In an exemplary embodiment, the set of arithmetic operations may include a portion of the proxy operation. In an exemplary embodiment, the proxy operation may be divided into several sets of arithmetic operations, and a respective IP core of the plurality of IP cores may be customized to perform each set of arithmetic operations.

Figure 2B:
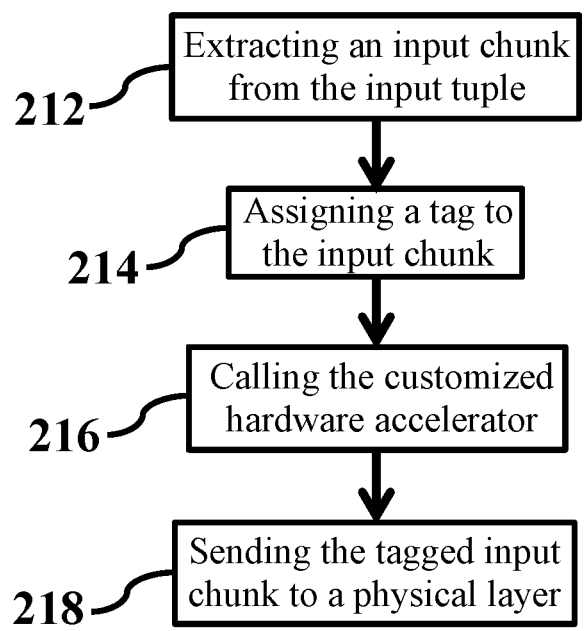
FIG. 2B shows a flowchart for sending an input tuple from a proxy bolt to a customized hardware accelerator, consistent with one or more exemplary embodiments of the present disclosure.

In further detail with respect to step 206, FIG. 2B shows a flowchart for sending an input tuple from a proxy bolt to a customized hardware accelerator, consistent with one or more exemplary embodiments of the present disclosure. In an exemplary embodiment, sending input tuple 110 from proxy bolt 108 to the customized hardware accelerator (step 206) may include extracting an input chunk of a plurality of input chunks from input tuple 110 (step 212), assigning a tag to the input chunk (step 214), calling the customized hardware accelerator utilizing an application programming interface (API) (step 216), and sending the tagged input chunk to a physical layer of the customized hardware accelerator (step 218). In an exemplary embodiment, the tag and the API may be associated with the proxy bolt. In an exemplary embodiment, the proxy bolt may communicate with the hardware accelerator utilizing the API. In addition, the tag may be assigned to data communicated between the proxy bolt and the hardware accelerator. In an exemplary embodiment, the physical layer may include a peripheral component interconnect express (PCIe) interface.

Figure 2C:
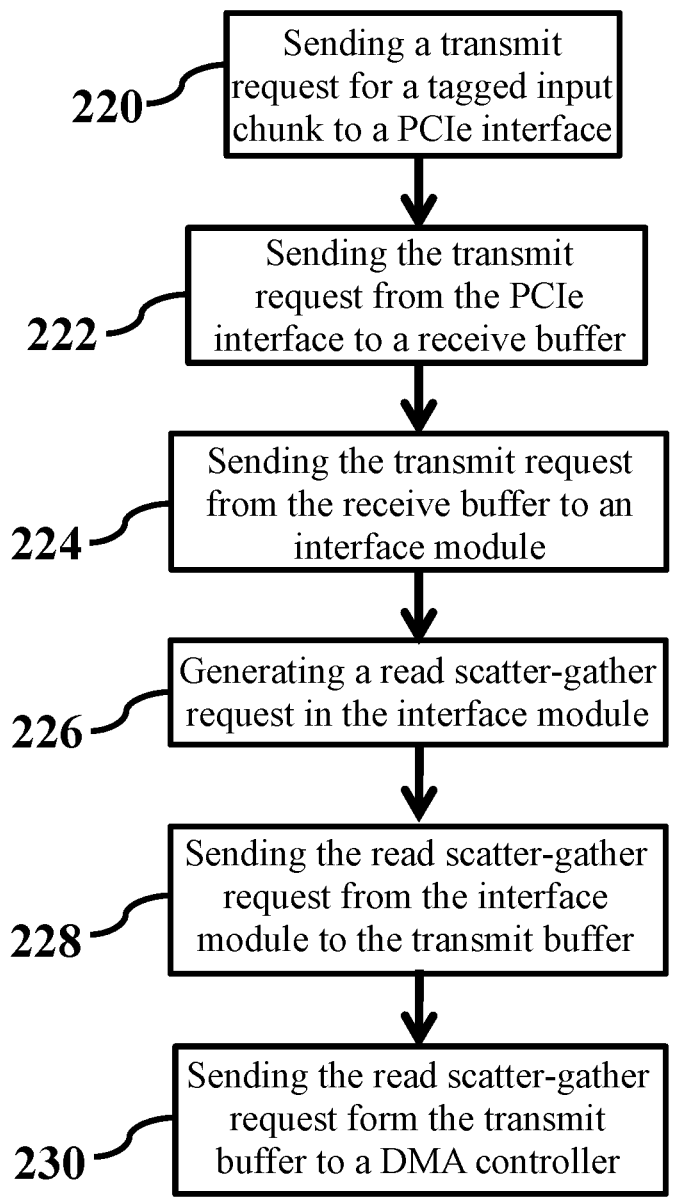
FIG. 2C shows a flowchart for calling a customized hardware accelerator, consistent with one or more exemplary embodiments of the present disclosure.

In further detail with regards to step 216, FIG. 2C shows a flowchart for calling a customized hardware accelerator, consistent with one or more exemplary embodiments of the present disclosure. In an exemplary embodiment, calling the customized hardware accelerator may include sending a transmit request for the tagged input chunk from proxy bolt 108 to the PCIe interface through a PCIe link utilizing the API (step 220), sending the transmit request from the PCIe interface to the receive buffer (step 222), sending the transmit request from the receive buffer to an interface module of a plurality of interface modules utilizing a distributor module (step 224), generating a read scatter-gather request for a plurality of scatter-gather elements associated with the tagged input chunk in the interface module (step 226), sending the read scatter-gather request from the interface module to the transmit buffer utilizing the distributor module (step 228), and sending the read scatter-gather request form the transmit buffer to a direct memory access (DMA) controller through the PCIe interface (step 230). In an exemplary embodiment, the transmit request may be associated with the tag. For example, the transmit request may be labeled with a number corresponding to the tag. In an exemplary embodiment, the plurality of read scatter-gather elements stored in a memory.

For further detail with respect to step 218, in an exemplary embodiment, sending the tagged input chunk to the physical layer (step 218) may include sending the tagged input chunk to the PCIe interface through the PCIe link. In an exemplary embodiment, sending the tagged input chunk to the PCIe interface may include sending each of the plurality of scatter-gather elements from the memory to the PCIe interface through the PCIe link utilizing the DMA controller.

Using the PCIe link for communication between topology 100 and the hardware accelerator may provide a number of advantages including ease of use due to availability of PCIe links on commercial servers and personal computers, high bandwidth, scalability of the bandwidth by changing the number of PCIe lanes, low delay of data transfer, and providing a direct memory access (DMA) feature for communication between FPGAs and central processing units. Since a low communication delay and a high throughput may be advantageous features in real-time processing of stream data, the PCIe link may be suitable for stream data processing in real-time.

Figure 2D:
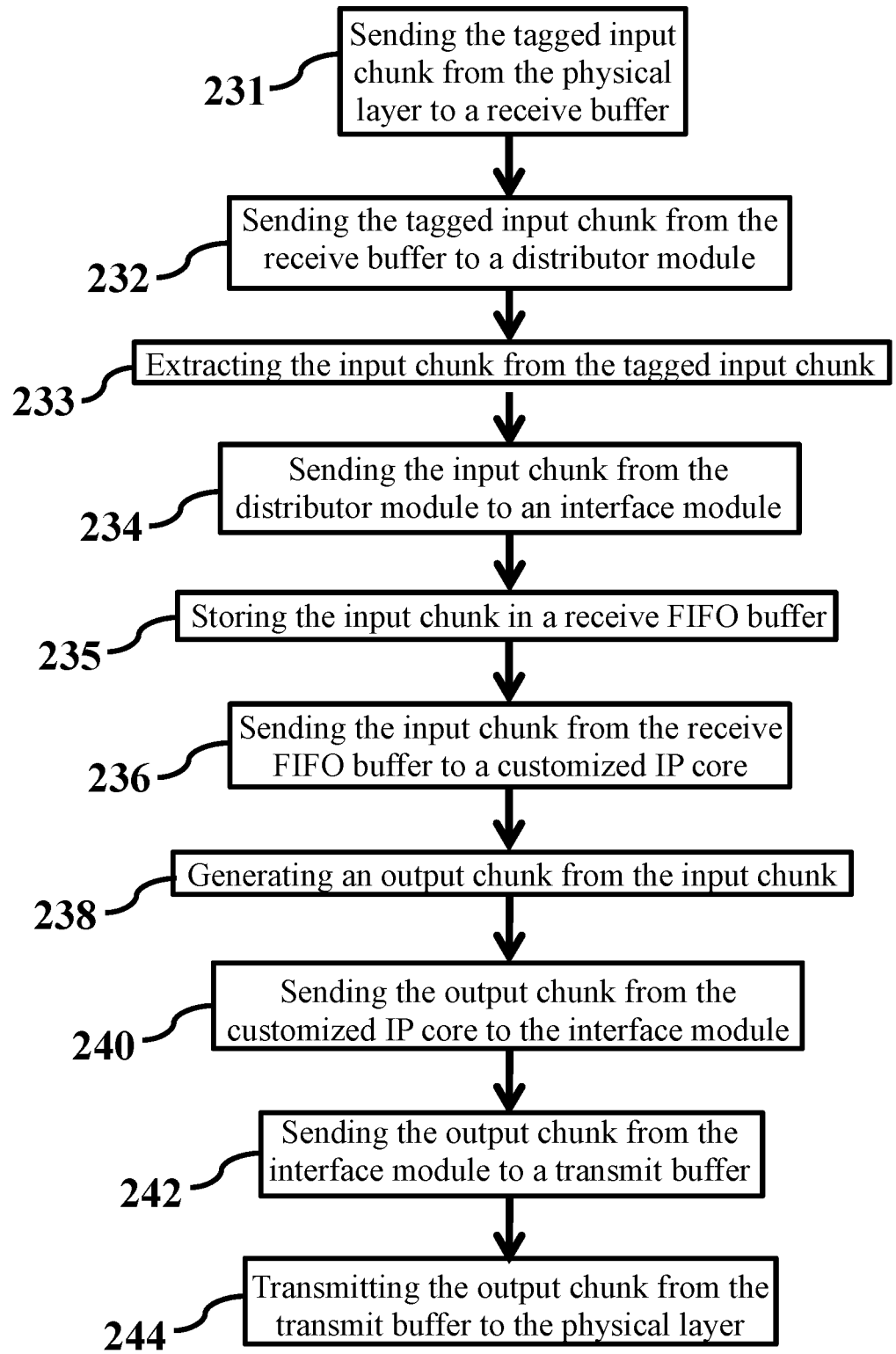
FIG. 2D shows a flowchart for performing a proxy operation on an input tuple in a customized hardware accelerator, consistent with one or more exemplary embodiments of the present disclosure.

In further detail with respect to step 208, FIG. 2D shows a flowchart for performing a proxy operation on an input tuple in a customized hardware accelerator, consistent with one or more exemplary embodiments of the present disclosure. In an exemplary embodiment, performing the proxy operation on input tuple 110 in the customized hardware accelerator may include sending the tagged input chunk from the physical layer to a receive buffer (step 231), sending the tagged input chunk from the receive buffer to a distributor module (step 232), extracting the input chunk from the tagged input chunk in the distributor module (step 233), sending the input chunk from the distributor module to an interface module of a plurality of interface modules (step 234), storing the input chunk in a receive first-in-first-out (FIFO) buffer (step 235), sending the input chunk from the receive FIFO buffer to the customized IP core (step 236), generating an output chunk of a plurality of output chunks from the input chunk by processing the input chunk in the customized IP core (step 238), sending the output chunk from the customized IP core to the interface module (step 240), sending the output chunk from the interface module to a transmit buffer utilizing the distributor module (step 242), and transmitting the output chunk from the transmit buffer to the physical layer (244).

In an exemplary embodiment, the receive buffer may refer to a buffer in the customized hardware accelerator that may be configured to receive data from the physical layer. In an exemplary embodiment, the transmit buffer may refer to a buffer in the customized hardware accelerator that may be configured to transmit data to the physical layer. In an exemplary embodiment, the distributor module may refer to a module in the customized hardware accelerator that is configured to distribute data from the receive buffer to a respective IP core via a respective interface module, and gather distributed data from different IP cores to be sent to the transmit buffer. In an exemplary embodiment, the interface module may refer to a module in the hardware accelerator that may be configured to manage communications with a respective IP core of the plurality of IP cores. In an exemplary embodiment, the receive FIFO buffer may refer to a buffer in the interface module that may be configured to store received data from the distributor module according to a FIFO method. In an exemplary embodiment, the interface module may be associated with the tag. For example, the interface module may be labelled with a number corresponding to the tag. In an exemplary embodiment, the tagged input chunk may refer to a data structure that may include both the input chunk and the tag.

Figure 2E:
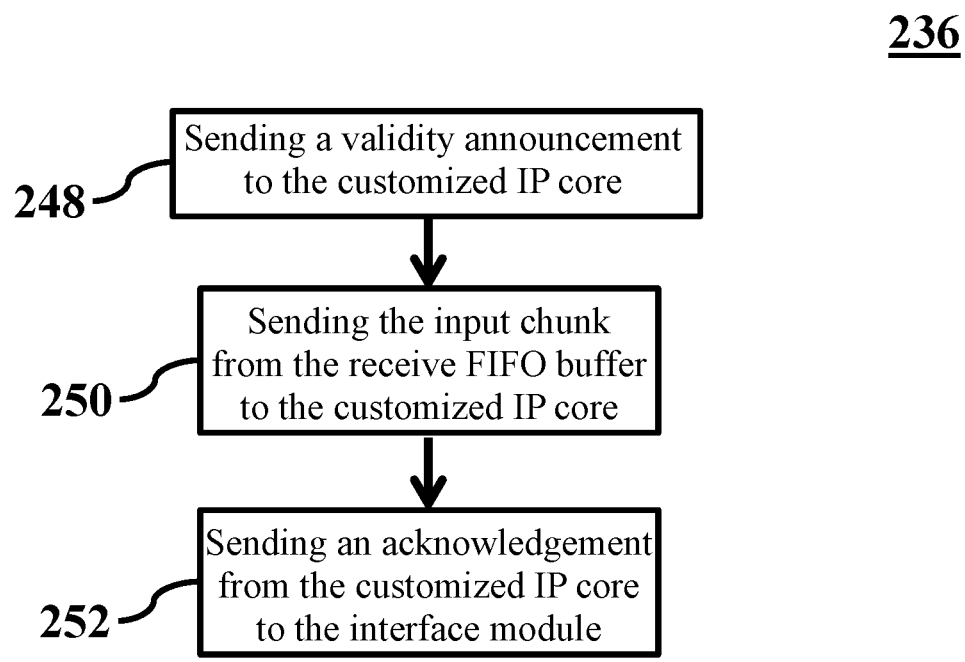
FIG. 2E shows a flowchart for sending an input chunk from an interface module to a customized intellectual property (IP) core, consistent with one or more exemplary embodiments of the present disclosure.

In further detail with respect to step 236, FIG. 2E shows a flowchart for sending an input chunk from a receive FIFO buffer to a customized IP core, consistent with one or more exemplary embodiments of the present disclosure. In an exemplary embodiment, sending the input chunk from the receive FIFO buffer to the customized IP core (step 236) may include sending a validity announcement to the customized IP core responsive to the input chunk being stored in the receive FIFO buffer (step 248), sending the input chunk from the receive FIFO buffer to the customized IP core responsive to the validity announcement being received in the customized IP core (step 250), and sending an acknowledgement from the customized IP core to the interface module responsive to receiving the input chunk from the receive FIFO buffer in the customized IP core (step 252). In an exemplary embodiment, the validity announcement may be sent by sending a respective signal that may be activated when the input chunk is stored in the receive FIFO buffer. Similarly, the acknowledgment may be sent by sending a respective signal that may be activated when the input chunk is received in the customized IP core.

For further detail with regards to step 240, in an exemplary embodiment, sending the output chunk from the customized IP core to the interface module (step 240) may include sending the output chunk to a transmit FIFO buffer responsive to receiving an announcement of validity of output data from the customized IP core in the interface module.

Figure 2F:
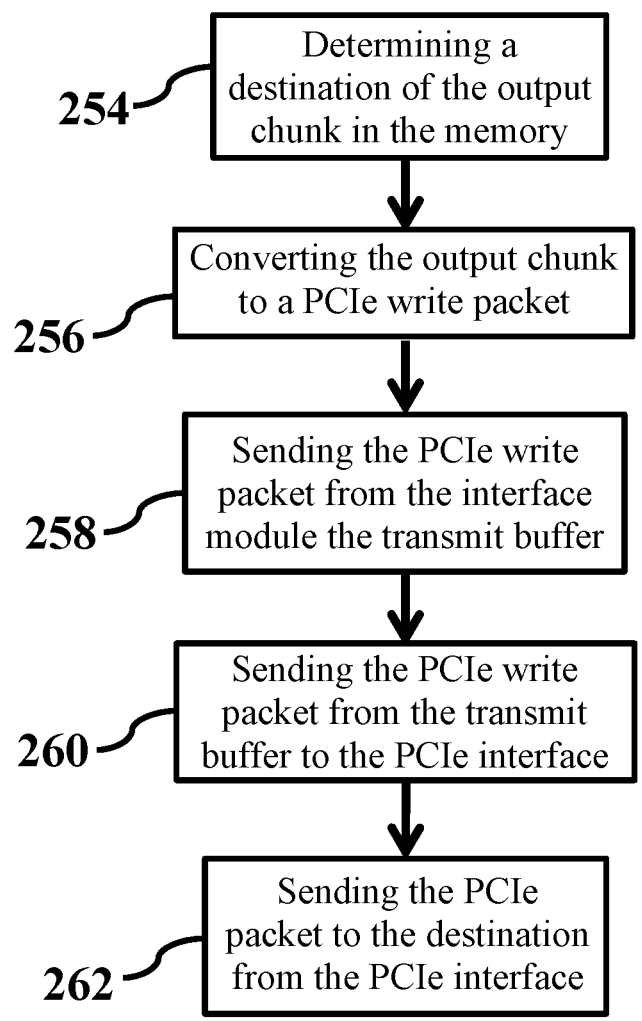
FIG. 2F shows a flowchart for sending an output tuple from a customized hardware accelerator to a proxy bolt, consistent with one or more exemplary embodiments of the present disclosure.

Referring again to FIG. 2A, for further detail with respect to step 210, FIG. 2F shows a flowchart for sending an output tuple from a customized hardware accelerator to a proxy bolt, consistent with one or more exemplary embodiments of the present disclosure. In an exemplary embodiment, sending the output tuple from the customized hardware accelerator to proxy bolt 108 (step 210) may include determining a destination of the output chunk in the memory based on the tag (step 254), converting the output chunk to a PCIe write packet in the interface module (step 256), sending the PCIe write packet from the interface module to the transmit buffer utilizing the distributor module (step 258), sending the PCIe write packet from the transmit buffer to the PCIe interface (step 260), and sending the PCIe write packet to the destination from the PCIe interface through the PCIe link utilizing the DMA (step 262). By using a DMA data transfer method, the PCIe bandwidth may be used efficiently.

For further detail with respect to steps 254-262, in an exemplary embodiment, a predefined location in the memory may be labeled according to the tag. In an exemplary embodiment, determining the destination of the output chunk in step 254 may include determining the labeled location in the memory as the destination of the output chunk. In an exemplary embodiment, steps 256-262 may be implemented according to PCIe protocols.

Figure 3:
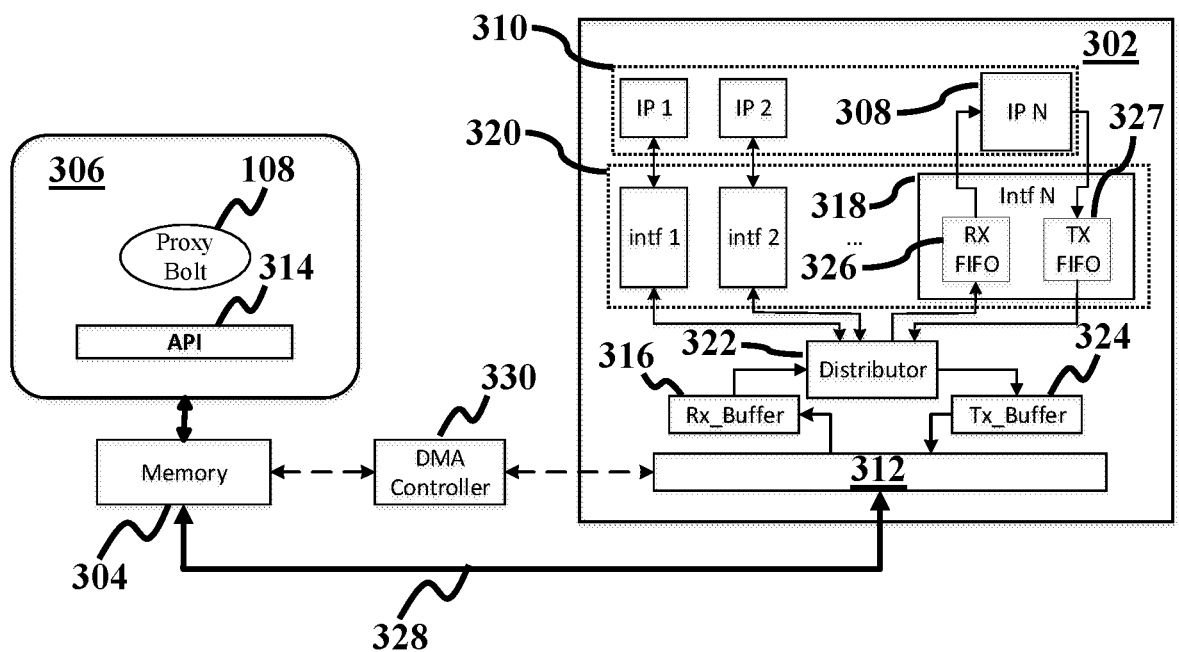
FIG. 3 shows a schematic of a system for hardware accelerated distributed stream processing, consistent with one or more exemplary embodiments of the present disclosure.

FIG. 3 shows a schematic of a system for hardware accelerated distributed stream processing, consistent with one or more exemplary embodiments of the present disclosure. In an exemplary embodiment, different steps of method 200 may be implemented by utilizing an exemplary system 300. In an exemplary embodiment, system 300 may include a hardware accelerator 302, a memory 304, and a processor 306. In an exemplary embodiment, processor 306 may be configured to send input tuple 110 from proxy bolt 108 to hardware accelerator 302. In an exemplary embodiment, hardware accelerator 302 may be configured to be customized based on the proxy operation, generate the output tuple by performing the proxy operation on input tuple 110, and send the output tuple to proxy bolt 108.

In an exemplary embodiment, hardware accelerator 302 may include at least one IP core 308 of a plurality of IP cores 310 and a physical layer 312. In an exemplary embodiment, physical layer 312 may include a peripheral component interconnect express (PCIe) interface. In an exemplary embodiment, IP core 308 may be configured to be customized based on the proxy operation. In an exemplary embodiment, the customized IP core may be associated with proxy bolt 108. In an exemplary embodiment, plurality of IP cores 310 may form an application layer, which may be available for a user to write desired operations on each of plurality of IP cores 310.

In an exemplary embodiment, processor 306 may be further configured to extract an input chunk of a plurality of input chunks from the input tuple, assign a tag to the input chunk, call the hardware accelerator utilizing an API 314, and send the tagged input chunk to physical layer 312.

In an exemplary embodiment, hardware accelerator 302 may further include a receive buffer 316, an interface module 318 of a plurality of interface modules 320, a distributor module 322, and a transmit buffer 324. In an exemplary embodiment, receive buffer 316 may be configured to receive the tagged input chunk from physical layer 312. In an exemplary embodiment, interface module 318 may be associated with the tag. In an exemplary embodiment, distributor module 322 may be configured to extract the input chunk from the tagged input chunk and send the input chunk from receive buffer 316 to interface module 318.

In an exemplary embodiment, physical layer 312, receive buffer 316, plurality of interface modules 320, distributor module 322, and transmit buffer 324 may form an infrastructure layer for performing data transfer related operations. Separating the application and the infrastructure layers may hide complexities of data transfer from users and may facilitate using separate clocks for the infrastructure and the application layers. Furthermore, the users may be able to use high level synthesis (HLS) tools for writing operations in plurality of IP cores 310.

In an exemplary embodiment, interface module 318 may include a receive first-in-first-out (FIFO) buffer 326 and a transmit FIFO buffer 327. In an exemplary embodiment, receive FIFO buffer 326 may be configured to store the input chunk, announce validity of input data to IP core 308 responsive to the input chunk being stored, and send the input chunk to IP core 308 responsive to receiving an acknowledgment to the announcement of the validity of input data from IP core 308. In an exemplary embodiment, transmit FIFO buffer 327 may be configured to receive the output chunk from IP core 308 responsive to receiving an announcement of validity of output data from IP core 308.

In an exemplary embodiment, customized IP core 308 may be further configured to receive the input chunk from interface module 318, generate the output chunk from the input chunk by processing the input chunk, and send the output chunk to interface module 318. In an exemplary embodiment, transmit buffer 324 may be configured to receive the output chunk from interface module 318 utilizing distributor module 322, and transmit the output chunk to physical layer 312.

In an exemplary embodiment, hardware accelerator 302 may include a reconfigurable hardware architecture. In an exemplary embodiment, the reconfigurable hardware architecture may include an FPGA.

In an exemplary embodiment, processor 306 may be further configured to call the FPGA by sending a transmit request for the tagged input chunk from proxy bolt 108 to the PCIe interface of the FPGA through a PCIe link 328 utilizing API 314, sending the transmit request from the PCIe interface to receive buffer 316, sending the transmit request from receive buffer 316 to interface module 318 utilizing distributor module 322, generating a read scatter-gather request for a plurality of scatter-gather elements associated with the tagged input chunk in interface module 318, sending the read scatter-gather request from interface module 318 to transmit buffer 324 utilizing distributor module 322, and sending the read scatter-gather request form transmit buffer 324 to a DMA controller 330 through the PCIe interface. In an exemplary embodiment, the transmit request may be associated with the tag. In an exemplary embodiment, the read scatter-gather elements stored in memory 304.

In an exemplary embodiment, DMA controller 330 may be configured to send the tagged input chunk from proxy bolt 108 to physical layer 312 by sending a plurality of scatter-gather elements from memory 304 to the PCIe interface through PCIe link 328, determine a destination of the output chunk in memory 304 based on the tag, and send a PCIe write packet to the destination from the PCIe interface through PCIe link 328. In an exemplary embodiment, the plurality of scatter-gather elements may be associated with the tagged input chunk, and the PCIe write packet may be associated with the output chunk.

Figure 4:
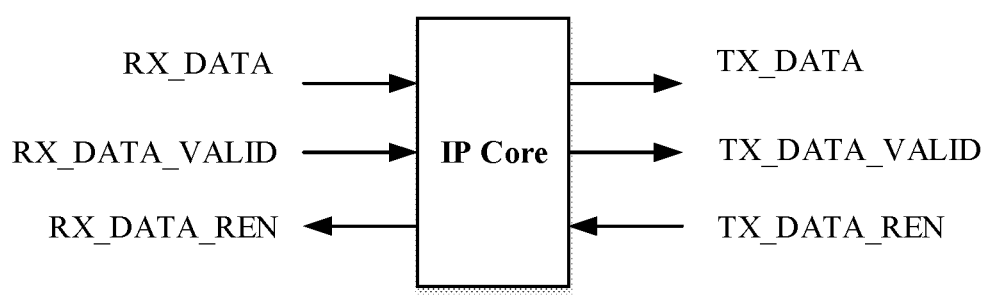
FIG. 4 shows a schematic of an intellectual property (IP) core, consistent with one or more exemplary embodiments of the present disclosure.

FIG. 4 shows a schematic of an IP core, consistent with one or more exemplary embodiments of the present disclosure. An exemplary IP core 400 may be analogous to IP core 308. In an exemplary embodiment, input data of IP core 400 may be placed on RX_DATA utilizing an interface module similar to interface module 318. In an exemplary embodiment, output data of IP core 400 may be placed on TX_DATA to be fed to an interface module similar to interface module 318. In an exemplary embodiment, validity of the input data on RX_DATA may be announced to IP core 400 by RX_DATA_VALID. In an exemplary embodiment, validity of the output data on TX_DATA may be announced to the interface module by TX_DATA_VALID. In an exemplary embodiment, consumption of received and sent data of IP core 400 may be announced by RX_DATA_REN and TX_DATA_REN, respectively.

Figure 5:
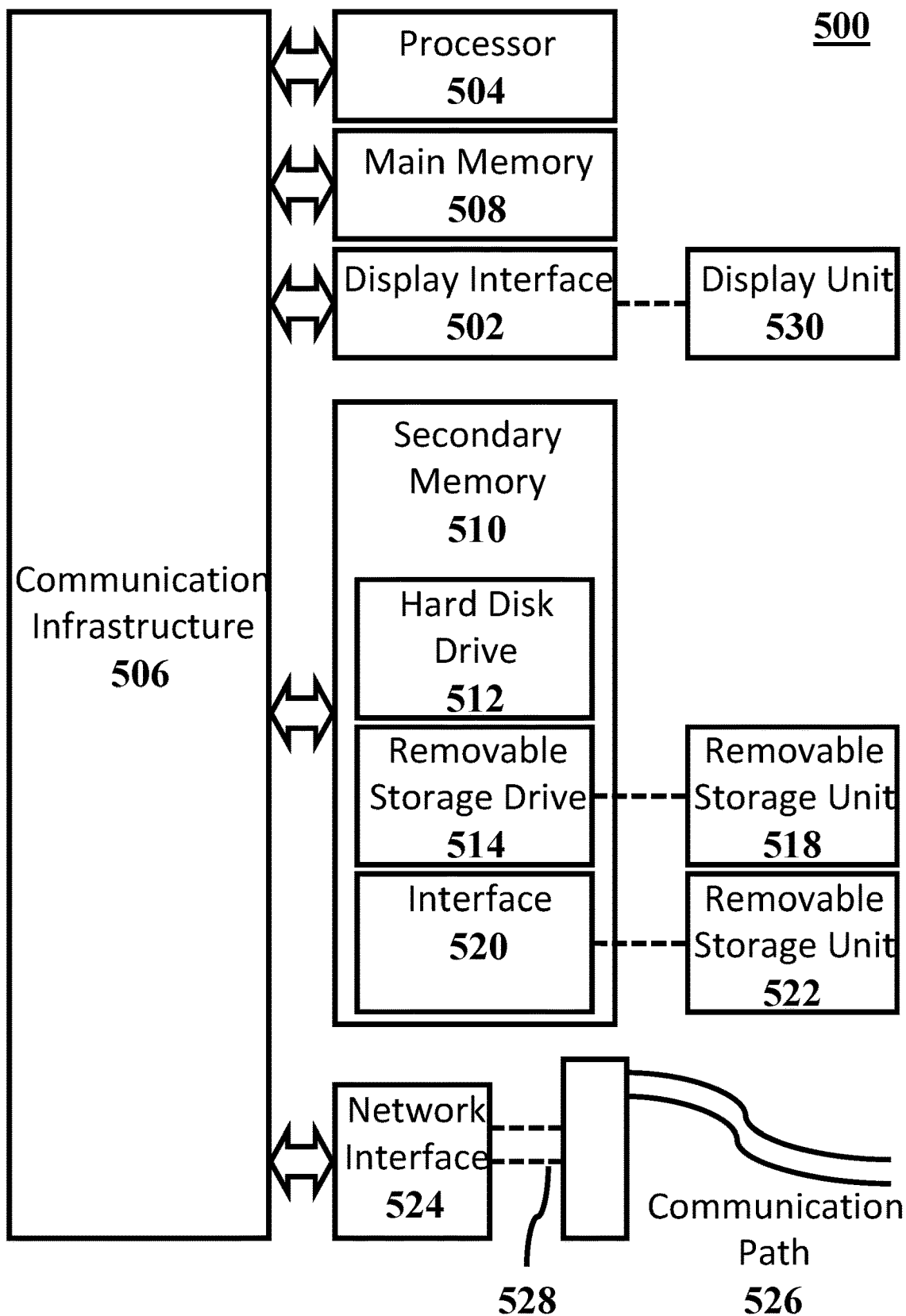
FIG. 5 shows a high-level functional block diagram of a computer system, consistent with one or more exemplary embodiments of the present disclosure.

FIG. 5 shows an example computer system 500 in which an embodiment of the present disclosure, or portions thereof, may be implemented as computer-readable code, consistent with exemplary embodiments of the present disclosure. For example, method 200 may be implemented in computer system 500 using hardware, software, firmware, tangible computer readable media having instructions stored thereon, or a combination thereof and may be implemented in one or more computer systems or other processing systems. Hardware, software, or any combination of such may embody any of the modules and components in FIGS. 1-4.

If programmable logic is used, such logic may execute on a commercially available processing platform or a special purpose device. One ordinary skill in the art may appreciate that an embodiment of the disclosed subject matter can be practiced with various computer system configurations, including multi-core multiprocessor systems, minicomputers, mainframe computers, computers linked or clustered with distributed functions, as well as pervasive or miniature computers that may be embedded into virtually any device.

For instance, a computing device having at least one processor device and a memory may be used to implement the above-described embodiments. A processor device may be a single processor, a plurality of processors, or combinations thereof. Processor devices may have one or more processor "cores."

An embodiment of the invention is described in terms of this example computer system 500. After reading this description, it will become apparent to a person skilled in the relevant art how to implement the invention using other computer systems and/or computer architectures. Although operations may be described as a sequential process, some of the operations may in fact be performed in parallel, concurrently, and/or in a distributed environment, and with program code stored locally or remotely for access by single or multiprocessor machines. In addition, in some embodiments the order of operations may be rearranged without departing from the spirit of the disclosed subject matter.

Processor device 504 may be a special purpose or a general-purpose processor device. As will be appreciated by persons skilled in the relevant art, processor device 504 may also be a single processor in a multi-core/multiprocessor system, such system operating alone, or in a cluster of computing devices operating in a cluster or server farm. Processor device 504 may be connected to a communication infrastructure 506, for example, a bus, message queue, network, or multi-core message-passing scheme.

In an exemplary embodiment, computer system 500 may include a display interface 502, for example a video connector, to transfer data to a display unit 530, for example, a monitor. Computer system 500 may also include a main memory 508, for example, random access memory (RAM), and may also include a secondary memory 510. Secondary memory 510 may include, for example, a hard disk drive 512, and a removable storage drive 514. Removable storage drive 514 may include a floppy disk drive, a magnetic tape drive, an optical disk drive, a flash memory, or the like. Removable storage drive 514 may read from and/or write to a removable storage unit 518 in a well-known manner. Removable storage unit 518 may include a floppy disk, a magnetic tape, an optical disk, etc., which may be read by and written to by removable storage drive 514. As will be appreciated by persons skilled in the relevant art, removable storage unit 518 may include a computer usable storage medium having stored therein computer software and/or data.

In alternative implementations, secondary memory 510 may include other similar means for allowing computer programs or other instructions to be loaded into computer system 500. Such means may include, for example, a removable storage unit 522 and an interface 520. Examples of such means may include a program cartridge and cartridge interface (such as that found in video game devices), a removable memory chip (such as an EPROM, or PROM) and associated socket, and other removable storage units 522 and interfaces 520 which allow software and data to be transferred from removable storage unit 522 to computer system 500.

Computer system 500 may also include a communications interface 524. Communications interface 524 allows software and data to be transferred between computer system 500 and external devices. Communications interface 524 may include a modem, a network interface (such as an Ethernet card), a communications port, a PCMCIA slot and card, or the like. Software and data transferred via communications interface 524 may be in the form of signals, which may be electronic, electromagnetic, optical, or other signals capable of being received by communications interface 524. These signals may be provided to communications interface 524 via a communications path 526. Communications path 526 carries signals and may be implemented using wire or cable, fiber optics, a phone line, a cellular phone link, an RF link or other communications channels.

In this document, the terms "computer program medium" and "computer usable medium" are used to generally refer to media such as removable storage unit 518, removable storage unit 522, and a hard disk installed in hard disk drive 512. Computer program medium and computer usable medium may also refer to memories, such as main memory 508 and secondary memory 510, which may be memory semiconductors (e.g. DRAMs, etc.).

Computer programs (also called computer control logic) are stored in main memory 508 and/or secondary memory 510. Computer programs may also be received via communications interface 524. Such computer programs, when executed, enable computer system 500 to implement different embodiments of the present disclosure as discussed herein. In particular, the computer programs, when executed, enable processor device 504 to implement the processes of the present disclosure, such as the operations in method 200 illustrated in FIGS. 2A-2C discussed above. Accordingly, such computer programs represent controllers of computer system 500. Where an exemplary embodiment of method 200 is implemented using software, the software may be stored in a computer program product and loaded into computer system 500 using removable storage drive 514, interface 520, and hard disk drive 512, or communications interface 524.

Embodiments of the present disclosure also may be directed to computer program products including software stored on any computer useable medium. Such software, when executed in one or more data processing device, causes a data processing device to operate as described herein. An embodiment of the present disclosure may employ any computer useable or readable medium. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, and optical storage devices, MEMS, nano-technological storage device, etc.).

The embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Example

In this example, the performance of an exemplary implementation of method 200 is evaluated. Among existing distributed stream processing frameworks (DSPFs), the Apache Storm framework is selected for implementing method 200 due to its widespread commercial usage. Since method 200 may be utilized for every topology similar to topology 100 of FIG. 1, any topology that is compatible with Storm may be supported by the framework of method 200.

In this example, 12 interface modules similar to plurality of interface modules 320 in FIG. 3 are utilized. For communicating between an exemplary host computer and an exemplary FPGA, an API of a reusable integration framework for the FPGA (RIFFA) is used. RIFFA is a framework for transferring data between host computers and the FPGAs using PCIe links. An FPGA driver and RIFFA libraries are installed on the host computer. The RIFFA libraries provide simple APIs like send and receive functions for calling the FPGA driver from applications. Using RIFFA may be suitable for achieving a high throughput and a low delay communication due to using a PCIe link, data transfer by a bus master scatter/gather DMA method, and being open source.

Each bolt in the Storm framework inherits a BaseRichBolt class and implements an IRichBolt interface. This interface has three major functions: prepare( ), execute( ) and declareOutputFields( ). The execute( ) function is responsible for processing each input tuple and generating the output tuple if needed. Generally, the running procedure of the proxy bolt may be divided into 4 stages: input data preparation for sending to the FPGA, interacting with the FPGA (sending data to FPGA, processing data in the FPGA, and receiving data from the FPGA), post processing the data, and calling emit( ) and ack( ) functions for converting the processed data to one or more tuples.

First, data that may be processed in the FPGA is extracted from an input tuple and is stored in a ByteBuffer. Next, send( ) and receive( ) functions are called and by using an API driver, communication between software and hardware is established. By calling the send( ) function, the data is sent to the FPGA, and after being processed in the FPGA, a result is received by the receive( ) function in the host computer. The send( ) and receive( ) functions transfer data as 64 bits chunks through the PCIe link, and these chunks are placed in FPGA queues. Extracted data from input tuples is sent to the FPGA as multiple 64 bit data chunks, and after being processed, data chunks of the result are sent to the Storm application running on the host computer (size of each data chunk may be set to 32 or 128 bits).

Figure 6:
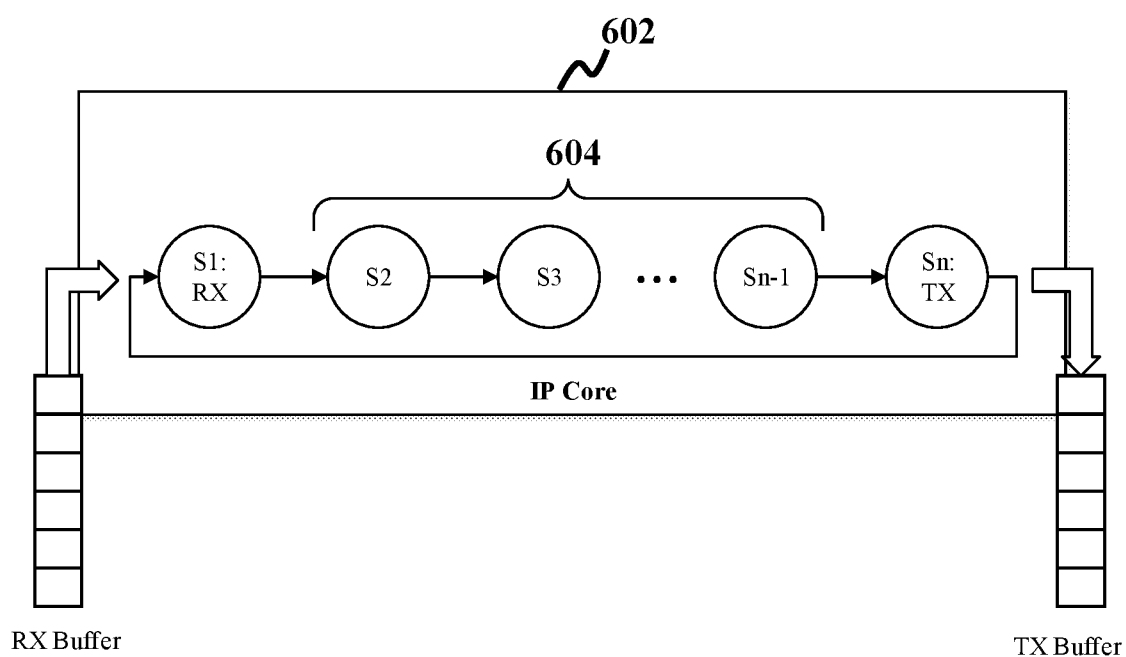
FIG. 6 shows different states of an intellectual property (IP) core, consistent with one or more exemplary embodiments of the present disclosure.

FIG. 6 shows different states of an IP core 602, consistent with one or more exemplary embodiments of the present disclosure. Each application has a receive state RX, a plurality of processing states 604, and a transmit state TX. Each 64 bits chunk enters IP core 602 in receive state RX, and after passing through plurality of processing states 604, the processing result enters transmit state TX for sending to host. All data chunks are treated in a same way.

Figure 7A:
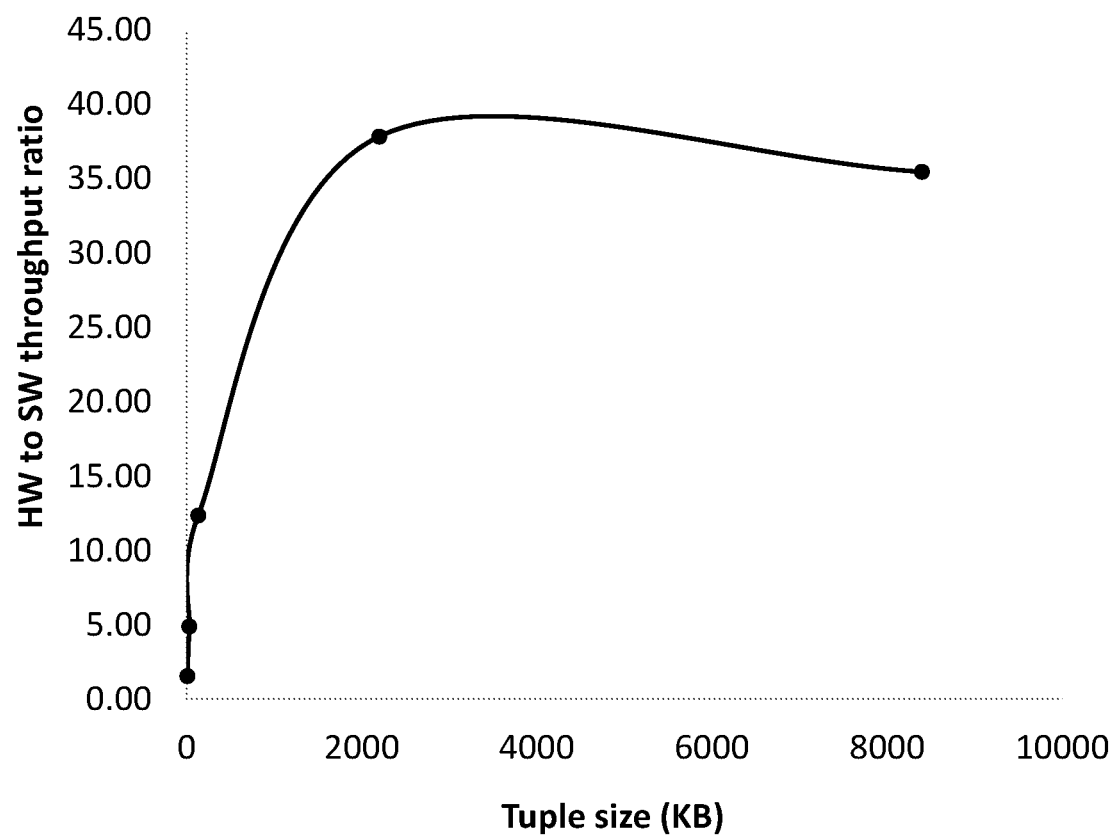
FIG. 7A shows variations of hardware to software throughput ratio for different tuple sizes in an image processing application, consistent with one or more exemplary embodiments of the present disclosure.
Figure 7B:
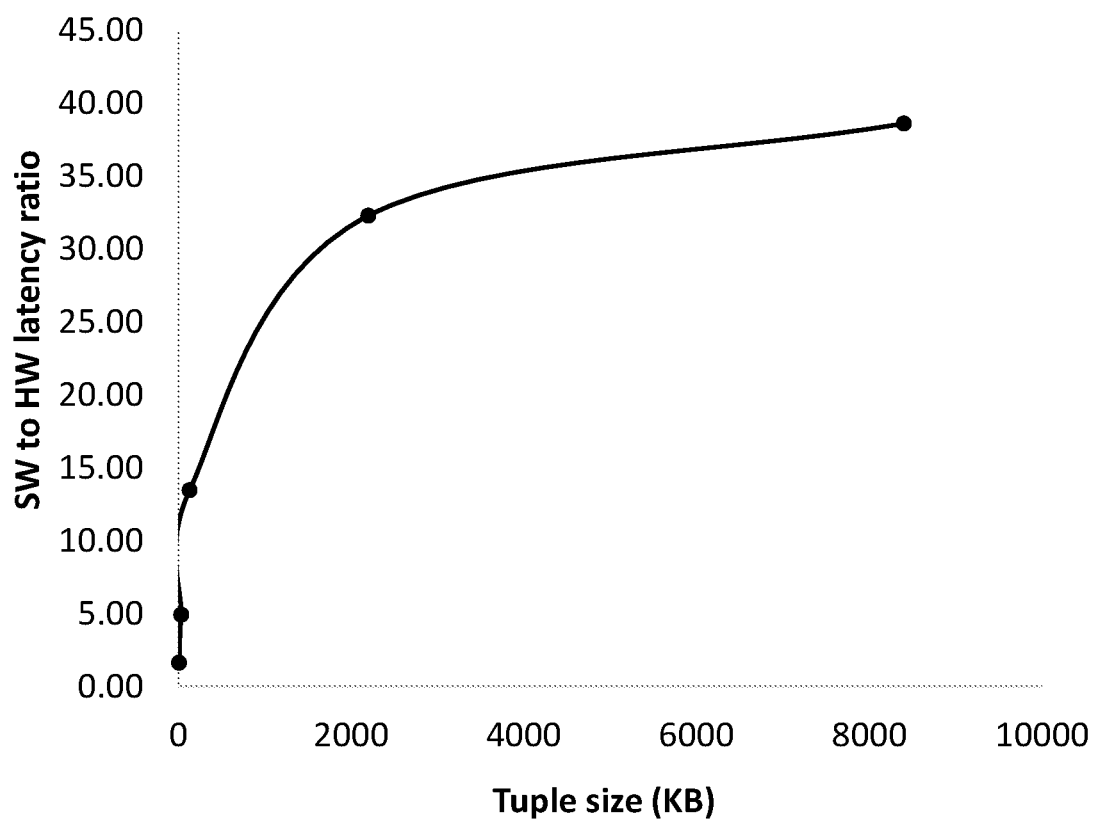
FIG. 7B shows variations of software to hardware latency ratio for different tuple sizes in an image processing application, consistent with one or more exemplary embodiments of the present disclosure.

FIG. 7A shows variations of hardware to software throughput ratio for different implementations of method 200 with different tuple sizes in an image processing application. An exemplary image processing algorithm is implemented by a topology that includes two proxy bolts. A first proxy bolt converts a colored image to a grayscale image and a second proxy bolt performs a sobel operation on the grayscale image. FIG. 7B shows variations of software to hardware latency ratio for different implementations of method 200 with different tuple sizes in the image processing application, consistent with one or more exemplary embodiments of the present disclosure.

While the foregoing has described what may be considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A method for accelerating distributed stream processing, the method comprising:
    allocating a hardware accelerator to a topology for distributed stream processing, the topology comprising:

a spout configured to prepare a plurality of tuples from a data stream, each of the plurality of tuples comprising a respective data structure; and a plurality of bolts configured to process the plurality of tuples, the plurality of bolts comprising a proxy bolt configured to assign a proxy operation on an input tuple of the plurality of tuples;

obtaining a customized hardware accelerator by customizing the hardware accelerator based on the proxy operation;

sending the input tuple from the proxy bolt to the customized hardware accelerator;

generating an output tuple of the plurality of tuples by performing the proxy operation on the input tuple in the customized hardware accelerator; and sending the output tuple from the customized hardware accelerator to the proxy bolt.

2. The method of claim 1, wherein customizing the hardware accelerator comprises obtaining a customized intellectual property (IP) core by customizing an IP core of a plurality of IP cores in the hardware accelerator based on the proxy operation, the customized IP core associated with the proxy bolt.

3. The method of claim 2, wherein sending the input tuple from the proxy bolt to the customized hardware accelerator comprises:

extracting an input chunk of a plurality of input chunks from the input tuple;

assigning a tag to the input chunk, the tag associated with the proxy bolt;

calling the customized hardware accelerator utilizing an application programming interface (API) associated with the proxy bolt; and sending the tagged input chunk to a physical layer of the customized hardware accelerator.

4. The method of claim 3, wherein performing the proxy operation on the input tuple in the customized hardware accelerator comprises:

sending the tagged input chunk from the physical layer to a receive buffer;

sending the tagged input chunk from the receive buffer to a distributor module;

extracting the input chunk from the tagged input chunk in the distributor module;

sending the input chunk from the distributor module to an interface module of a plurality of interface modules, the interface module associated with the tag;

storing the input chunk in a receive first-in-first-out (FIFO) buffer of the interface module;

sending the input chunk from the receive FIFO buffer to the customized IP core;

generating an output chunk of a plurality of output chunks from the input chunk by processing the input chunk in the customized IP core;

sending the output chunk from the customized IP core to the interface module;

sending the output chunk from the interface module to a transmit buffer utilizing the distributor module; and transmitting the output chunk from the transmit buffer to the physical layer.

5. The method of claim 4, wherein sending the input chunk from the receive FIFO buffer to the customized IP core comprises:

sending a validity announcement to the customized IP core responsive to the input chunk being stored in the receive FIFO buffer;

sending the input chunk from the receive FIFO buffer to the customized IP core responsive to the validity announcement being received in the customized IP core; and sending an acknowledgement from the customized IP core to the interface module responsive to receiving the input chunk from the receive FIFO buffer in the customized IP core.

6. The method of claim 4, wherein sending the output chunk from the customized IP core to the interface module comprises sending the output chunk to a transmit first-in-first-out (FIFO) buffer responsive to receiving an announcement of validity of output data from the customized IP core in the interface module.

7. The method of claim 4, wherein allocating the hardware accelerator to the topology comprises allocating a reconfigurable hardware architecture to the topology.

8. The method of claim 7, wherein allocating the reconfigurable hardware architecture to the topology comprises allocating a field programmable gate array (FPGA) to the topology.

9. The method of claim 8, wherein sending the tagged input chunk to the physical layer comprises sending the tagged input chunk to a peripheral component interconnect express (PCIe) interface of the FPGA through a PCIe link.

10. The method of claim 9, wherein calling the customized hardware accelerator comprises:

sending a transmit request for the tagged input chunk from the proxy bolt to the PCIe interface through the PCIe link utilizing the API, the transmit request associated with the tag;

sending the transmit request from the PCIe interface to the receive buffer;

sending the transmit request from the receive buffer to the interface module utilizing the distributor module;

generating a read scatter-gather request for a plurality of scatter-gather elements associated with the tagged input chunk in the interface module, the read scatter-gather elements stored in a memory;

sending the read scatter-gather request from the interface module to the transmit buffer utilizing the distributor module; and sending the read scatter-gather request form the transmit buffer to a direct memory access (DMA) controller through the PCIe interface.

11. The method of claim 10, wherein sending the tagged input chunk to the PCIe interface comprises sending each of the plurality of scatter-gather elements from the memory to the PCIe interface through the PCIe link utilizing the DMA controller.

12. The method of claim 11, wherein sending the output tuple from the customized hardware accelerator to the proxy bolt comprises:

determining a destination of the output chunk in the memory based on the tag;

converting the output chunk to a PCIe write packet in the interface module;

sending the PCIe write packet from the interface module the transmit buffer utilizing the distributor module;

sending the PCIe write packet from the transmit buffer to the PCIe interface; and sending the PCIe write packet to the destination from the PCIe interface through the PCIe link utilizing the DMA.

13. A system for accelerating distributed stream processing in a topology, the system comprising:

a hardware accelerator comprising a physical layer, the hardware accelerator configured to be allocated to the topology, the topology comprising:
   a spout configured to prepare a plurality of tuples from a data stream, each of the plurality of tuples comprising a respective data structure; and
   a plurality of bolts configured to process the plurality of tuples, the plurality of bolts comprising a proxy bolt configured to assign a proxy operation on an input tuple of the plurality of tuples;
a memory having processor-readable instructions stored therein; and
one or more processors configured to access the memory and execute the processor-readable instructions, which, when executed by the one or more processors configures the one or more processors to perform a method, the method comprising:
   extracting an input chunk of a plurality of input chunks from the input tuple;
   assigning a tag to the input chunk, the tag associated with the proxy bolt;
   calling the hardware accelerator utilizing an application programming interface (API) associated with the proxy bolt; and
   sending the tagged input chunk to the physical layer;
wherein the hardware accelerator is configured to:
   be customized based on the proxy operation;
   generate an output tuple of the plurality of tuples by performing the proxy operation on the input tuple; and
   send the output tuple to the proxy bolt.

14. The system of claim 13, wherein the hardware accelerator comprises:
   a receive buffer configured to receive the tagged input chunk from the physical layer;
   an interface module of a plurality of interface modules, the interface module associated with the tag;
   a distributor module configured to:
      extract the input chunk from the tagged input chunk; and
      send the input chunk from the receive buffer to the interface module;
   at least one intellectual property (IP) core configured to be customized based on the proxy operation, the customized IP core associated with the proxy bolt, the customized IP core configured to:
      receive the input chunk from the interface module;
      send an acknowledgement to the interface module responsive to receiving the input chunk from the interface module;
      generate an output chunk of a plurality of output chunks from the input chunk by processing the input chunk; and
      send the output chunk to the interface module; and
   a transmit buffer configured to:
      receive the output chunk from the interface module utilizing the distributor module; and
      transmit the output chunk to the physical layer.

15. The system of claim 14, wherein the interface module comprises:
   a receive first-in-first-out (FIFO) buffer configured to:
      store the input chunk;
      send a validity announcement to the customized IP core responsive to the input chunk being stored; and
      send the input chunk to the customized IP core responsive to sending the validity announcement to the customized IP core; and
   a transmit FIFO buffer configured to receive the output chunk from the customized IP core responsive to receiving an announcement of validity of output data from the customized IP core.

16. The system of claim 15, wherein the hardware accelerator comprises a field programmable gate array (FPGA).

17. The system of claim 16, wherein the physical layer comprises a peripheral component interconnect express (PCIe) interface.

18. The system of claim 17, further comprising a direct memory access (DMA) controller configured to:
   send the tagged input chunk from the proxy bolt to the physical layer by sending a plurality of scatter-gather elements associated with the tagged input chunk from the memory to the PCIe interface through the PCIe link;
   determine a destination of the output chunk in the memory based on the tag; and
send a PCIe write packet to the destination from the PCIe interface through the PCIe link, the PCIe write packet associated with the output chunk.

\* \* \* \* \*